United States Patent
Lin et al.

(10) Patent No.: US 8,519,535 B2
(45) Date of Patent: Aug. 27, 2013

(54) METHOD AND STRUCTURE FOR CONTROLLING PACKAGE WARPAGE

(75) Inventors: Tsung-Shu Lin, Yonghe (TW); Yuh Chern Shieh, Taipei (TW); Kuo-Chin Chang, Chiayi (TW)

(73) Assignee: Taiwan Semiconductor Manufacturing Co., Ltd., Hsin-Chin (TW)

( * ) Notice: Subject to any disclaimer, the term of this patent is extended or adjusted under 35 U.S.C. 154(b) by 125 days.

(21) Appl. No.: 13/105,360

(22) Filed: May 11, 2011

(65) Prior Publication Data

US 2012/0286417 A1    Nov. 15, 2012

(51) Int. Cl.
  *H01L 23/48* (2006.01)
  *H01L 23/52* (2006.01)
  *H01L 29/40* (2006.01)

(52) U.S. Cl.
  USPC .................................. 257/737; 257/E23.021

(58) Field of Classification Search
  USPC .......................................................... 257/737
  See application file for complete search history.

(56) References Cited

U.S. PATENT DOCUMENTS

| | | | | |
|---|---|---|---|---|
| 6,882,045 B2 * | 4/2005 | Massingill et al. | ........... | 257/724 |
| 7,071,569 B2 * | 7/2006 | Ho et al. | ........... | 257/778 |
| 7,522,538 B2 | 4/2009 | Rhim et al. | | |
| 7,602,062 B1 * | 10/2009 | Wang | ........... | 257/738 |
| 7,652,368 B2 * | 1/2010 | Hayashi et al. | ........... | 257/698 |
| 8,183,696 B2 * | 5/2012 | Meyer et al. | ........... | 257/774 |
| 2004/0084206 A1 * | 5/2004 | Tung | ........... | 174/255 |
| 2004/0090756 A1 * | 5/2004 | Ho et al. | ........... | 361/767 |
| 2005/0035464 A1 * | 2/2005 | Ho et al. | ........... | 257/778 |
| 2005/0178581 A1 | 8/2005 | Lee et al. | | |
| 2006/0076681 A1 | 4/2006 | Tsao et al. | | |
| 2009/0243065 A1 * | 10/2009 | Sugino et al. | ........... | 257/686 |
| 2010/0301474 A1 * | 12/2010 | Yang | ........... | 257/737 |
| 2011/0233771 A1 * | 9/2011 | Kwon et al. | ........... | 257/737 |
| 2012/0299179 A1 * | 11/2012 | Roy et al. | ........... | 257/737 |

OTHER PUBLICATIONS

Jadhav, V. et al., "Flip Chip Assembly Challenges Using High Density, Thin Core Carriers", Electronic Components and Technology Conference, 2005, Proceedings, 55th, 1:314-319.
"Joint Test Action Group", From Wikipedia, http://en.wikipedia.org/wiki/Jtag, 14 pages.
"Package on Package", From Wikipedia, http://en.wikipedia.org/wiki/Package_on_package, 3 pages.
"Design for Test", From Wikipedia, http://en.wikipedia.org/wiki/Design_for_test, 4 pages.

* cited by examiner

*Primary Examiner* — Jae Lee
*Assistant Examiner* — Grant Withers
(74) *Attorney, Agent, or Firm* — Duane Morris LLP; Steven E. Koffs

(57) ABSTRACT

A method comprises determining a warpage of an integrated circuit (IC) package design. The IC package design includes a substrate having a top solder mask on a first major surface and a bottom solder mask on a second major surface opposite the first major surface. The first major surface has an IC die mounted over the top solder mask. The design is modified, including modifying an average thickness of one of the group consisting of the top solder mask and the bottom solder mask, so as to reduce the warpage. An IC package is fabricated according to the modified design.

13 Claims, 9 Drawing Sheets

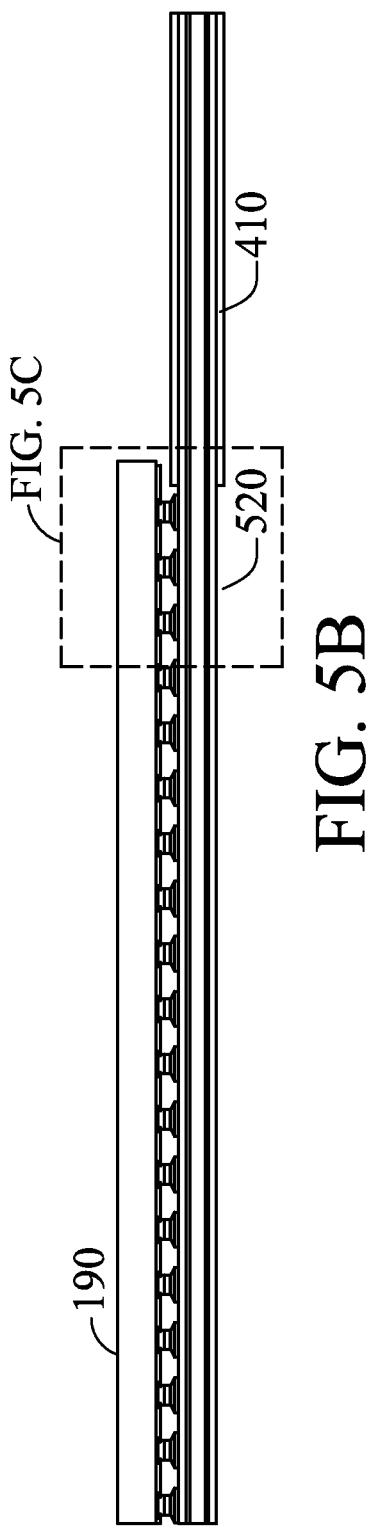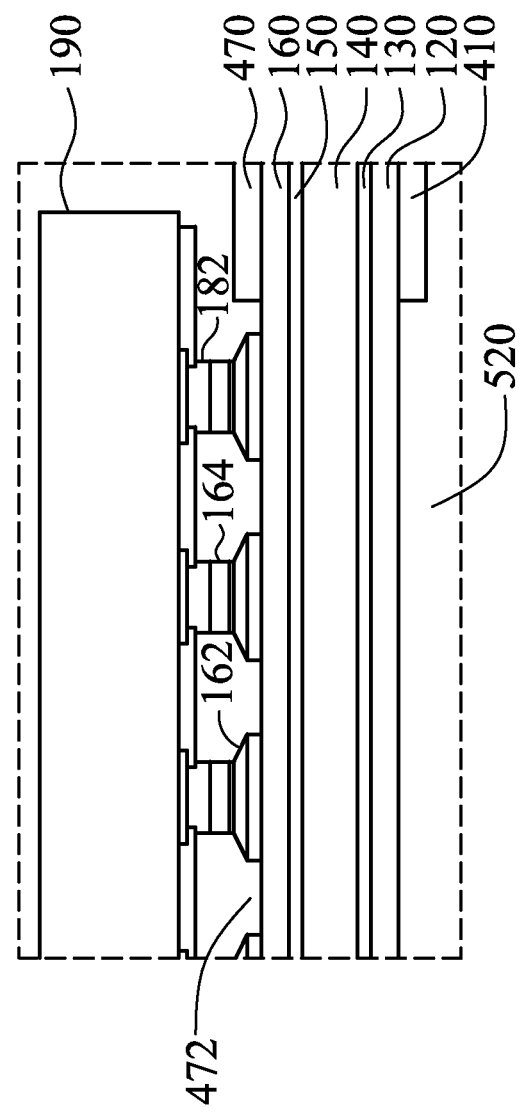

METHOD AND STRUCTURE FOR CONTROLLING PACKAGE WARPAGE

FIELD

This disclosure relates to semiconductor packaging.

BACKGROUND

Flip chip is a method for interconnecting semiconductor devices, such as integrated circuit (IC) chips to circuitry in a package substrate, using solder bumps deposited onto the IC pads. The solder bumps are deposited on the IC pads on the top side of the wafer during wafer processing. After singulation, the IC chip is flipped over so that its top side faces down, and aligned so that its pads align with matching pads on the package substrate, and then the solder is flowed to complete the interconnect. An underfill material is introduced into the space between the IC and substrate, surrounding the solder balls. The flip chip method uses substantially less space than wire bonding, enabling fabrication of a chip-scale package.

Flip chip package substrates must have very flat surfaces, which may be difficult to maintain as the boards heat and cool. Also, the solder ball connections are very stiff. If the IC and the package substrate have different coefficients of thermal expansion (CTE), differential expansion occurs when the package is heated and cooled. The differential expansion places large stress on the solder ball connections, which may cause the connections to crack or delaminate from the substrate, or cause warpage of the package substrate.

Additional challenges present themselves when a flip chip package is included in a three dimension (3D)-IC configuration, such as a package on package configuration. In a package on package configuration, two IC packages, such as an application specific IC (ASIC) and a memory package are installed one on top of the other. For example, the top package may be larger than the bottom package, and may have an array of solder balls around its perimeter for forming connections to the package substrate of the bottom package. Configurations such as package on package increase the likelihood of package substrate warpage.

BRIEF DESCRIPTION OF THE DRAWINGS

FIG. 4A is a bottom plan view. FIG. 4B is a side elevation view. FIG. 4C is an enlarged detail of FIG. 4B.

FIGS. 5A-5C show an embodiment having a window in the bottom solder mask. FIG. 5A is a bottom plan view. FIG. 5B is a side elevation view. FIG. 5C is an enlarged detail of FIG. 5B.

DETAILED DESCRIPTION

Figure 1:
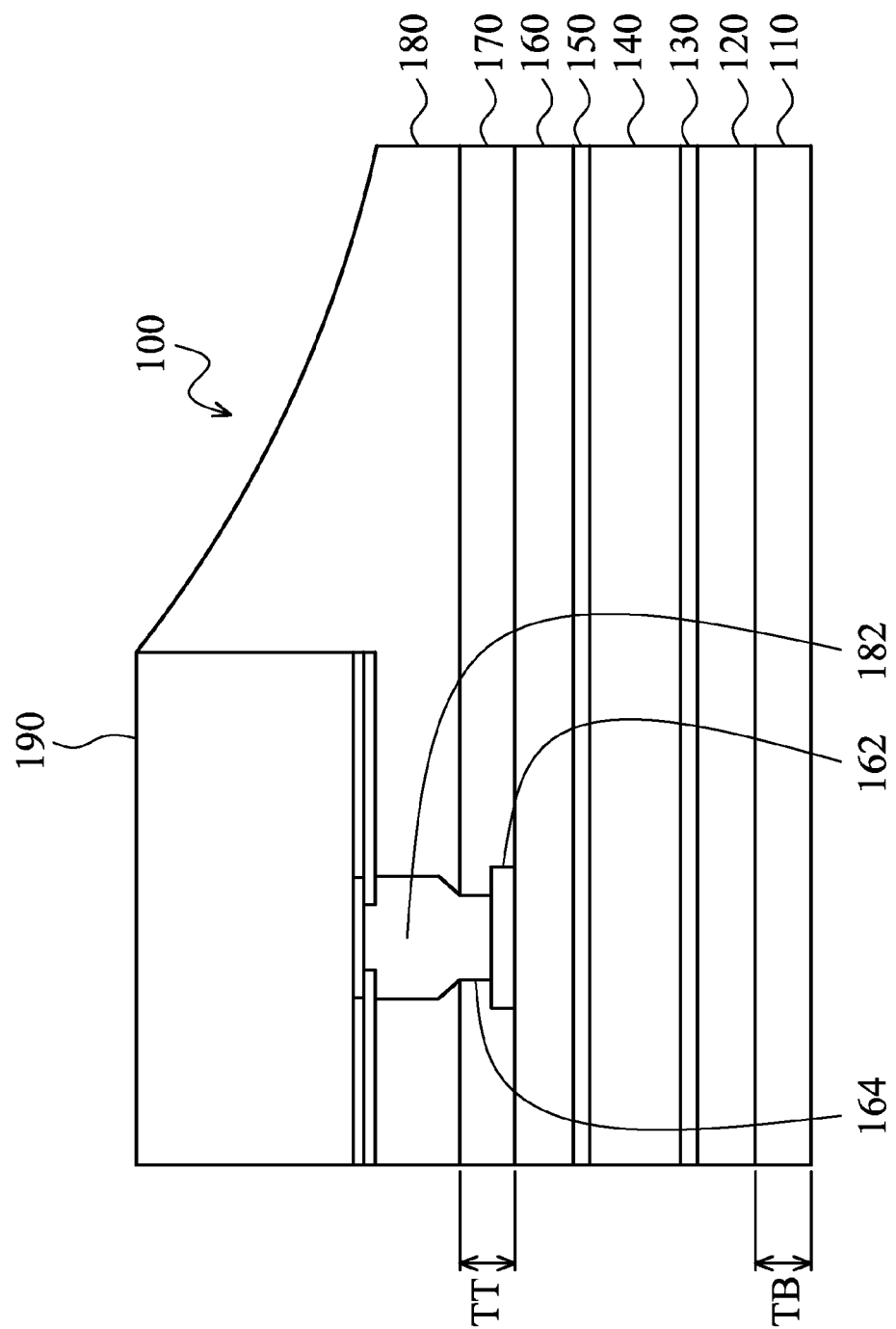
FIG. 1 is a cross sectional view of a corner of a flip chip mounted die.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures.

In the drawings, like reference numerals indicate like items, unless expressly stated otherwise.

The inventors have determined that in various embodiments of IC packages, the average solder mask thickness of the top solder mask and/or bottom solder mask, or the pattern of the bottom solder mask, may be configured to control package warpage and stress levels. Thus, the package process window and reliability can be improved. This technique is useful for a variety of packages, including but not limited to 3D IC packages, such as those having a package on package configuration.

FIG. 1 is a side cross sectional view of a package 100. The package 100 comprises a package substrate dielectric layer 140 which may be made from a dielectric such as FR-4 (Woven glass and epoxy), or other prepreg materials such as FR-2 (Phenolic cotton paper), FR-3 (Cotton paper and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), CEM-5 (Woven glass and polyester). In other embodiments, the substrate 140 may be made from polytetrafluoroethylene.

Conducting layers 130, 150 are formed on each major face of the substrate 140. The conductive layers may be made of thin copper foil, 15 μm thick, for example.

Additional insulating layers 120 and 160 may be formed on opposite sides of conductive layer 150 and conductive layer 130, as shown. Insulating layers 120 and 160 may be formed of dielectric laminated together with epoxy resin prepreg, for example, and may have additional conductive traces formed therein.

The substrate is coated on both sides of insulating layers 120, 160 with a polymer solder mask, including a top solder mask 170 on a first major surface (top in FIG. 1) and a bottom solder mask 110 on a second major surface, opposite the first major surface. The top solder mask 170 has a thickness TT and the bottom solder mask 110 has a thickness TB. Areas of the substrate that will not be soldered are covered with a solder resist (solder mask) coating. The solder resist prevents solder from bridging between conductors and creating short circuits. The solder mask 110, 170 may be an epoxy liquid that is silkscreened through the pattern onto the substrate 140. In some embodiments, the solder mask is made from a solder mask material such as PSR-4000 AUS703, sold by TAIYO AMERICA, INC., of Carson City, Nev.

Alternatively, in some embodiments, solder mask 110, 170 may be made of liquid photoimageable solder mask (LPSM) inks LPSM may be silkscreened or sprayed on the substrate 140, exposed to the pattern and developed to provide openings in the pattern for parts to be soldered to the copper pads. In other embodiments, solder mask 110, 170 may be made from dry film photoimageable solder mask (DFSM). DFSM is vacuum laminated on the printed circuit board (PCB) then exposed and developed. The solder resist 110, 170 may be from about 12 to about 40 micrometers thick, but the thickness may be varied, as discussed below. In some embodiments, the thickness TB is controlled to be at least 20 micrometers and less than 40 micrometers.

The first major surface (top) of the substrate has a plurality of conductive pads 162, with contacts 164 formed over the conductive pads 162. The IC 190 is flip chip mounted over solder resist 170, and the solder bumps 182 of the IC 190 are reflowed to form electrical and mechanical connections with the contacts 164. Reflow may be performed by bulk wave soldering or reflow ovens, for example. An underfill material 180 is applied to fill the space around the bumps 182 and fill the gap between the die 190 and the package substrate 140. The underfill material 180 forms a low warp seal that dissipates stress on solder joints and extends thermal cycling performance.

The IC 190 may be formed using a variety of technologies. The IC 190 may be formed on a silicon substrate, a III-V compound substrate, a silicon/germanium (SiGe) substrate, a silicon-on-insulator (SOI) substrate, or the like.

The thickness of the top solder mask 170 and/or bottom solder mask 110 may be changed, to control the warpage of the package substrate 140. By using different average thicknesses TT and TB in the top solder mask 170 and bottom solder mask 110, the warpage type of the package warpage in the laminate substrate 140 is changed.

Figures 2A, 2B, 2C:
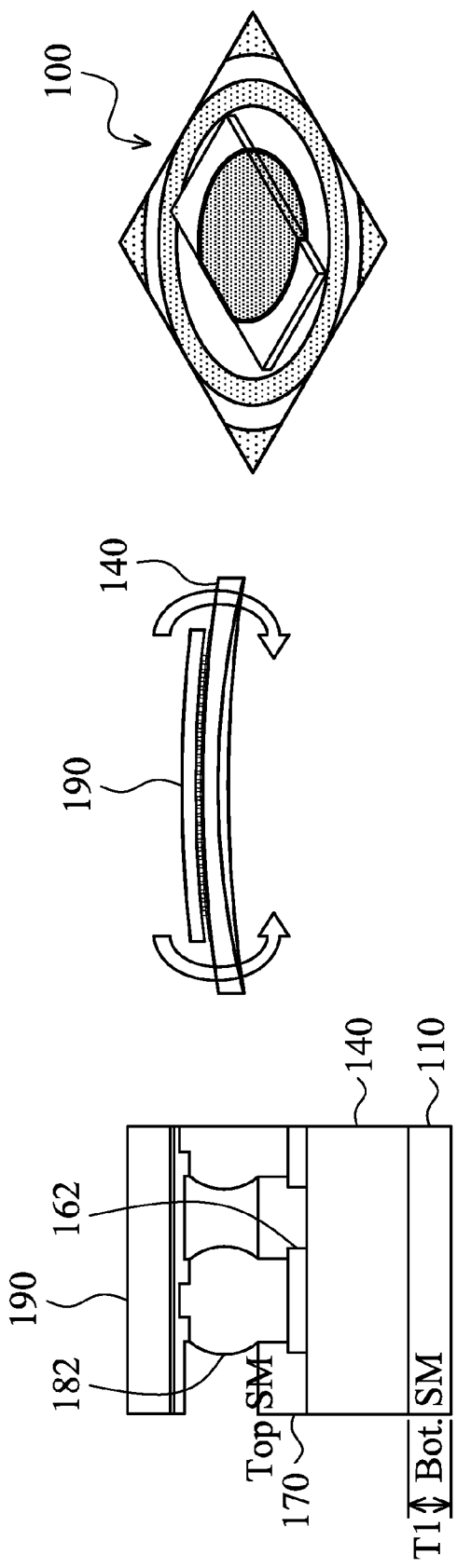
FIG. 2A is a cross sectional view of the package of FIG. 1, having a first bottom solder mask thickness.
FIG. 2B shows a warpage profile of the package in FIG. 2A.
FIG. 2C is a contour diagram of the package in FIG. 2B

For example, as shown in FIGS. 2A-2C, after die attach reflow and cooling of the substrate to 25° C., if the average thickness TB of bottom solder mask 110 substantially equals T1=the average thickness TT of top solder mask 170=40 µm, the result is a convex type of package warpage. For example, if TT=TB=40 µm, the result is concave warpage.

Figures 3A, 3B, 3C:
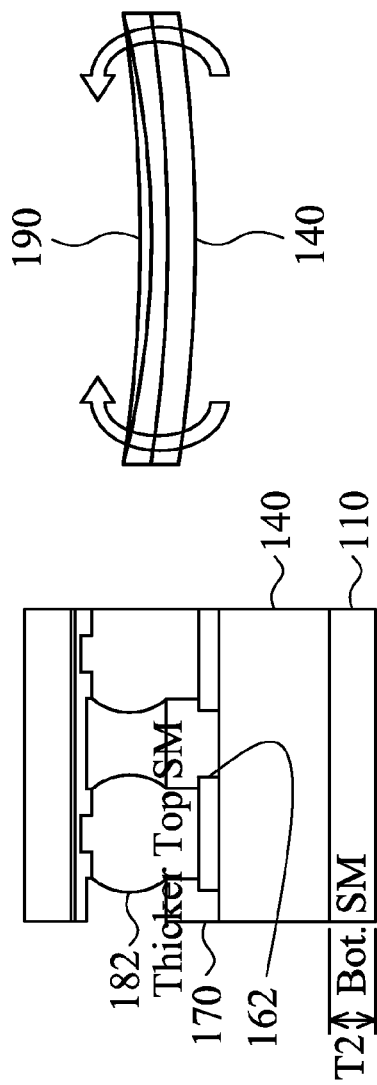
FIG. 3A is a cross sectional view of the package of FIG. 1, having a second bottom solder mask thickness.
FIG. 3B shows a warpage profile of the package in FIG. 3A.
FIG. 3C is a contour diagram of the package in FIG. 3B.

On the other hand, as shown in FIGS. 3A-3C, if the average thickness TB of bottom solder mask 110 is T2, which is less than the average thickness TT of top solder mask 170, the result is a concave type of package warpage. For example, if TT=40 µm, and TB=20 µm to 25 µm the result is concave warpage.

In some embodiments, the top solder mask 170 has a substantially uniform thickness TT, which is different from the substantially uniform thickness TB of the bottom solder mask. For example, the uniform thickness TB of the bottom solder mask 110 may be reduced to a thickness greater than or equal to 12 µm and less than 40 µm (the thickness of the top solder mask 170), to reduce the concavity of the substrate warpage.

Figure 6:
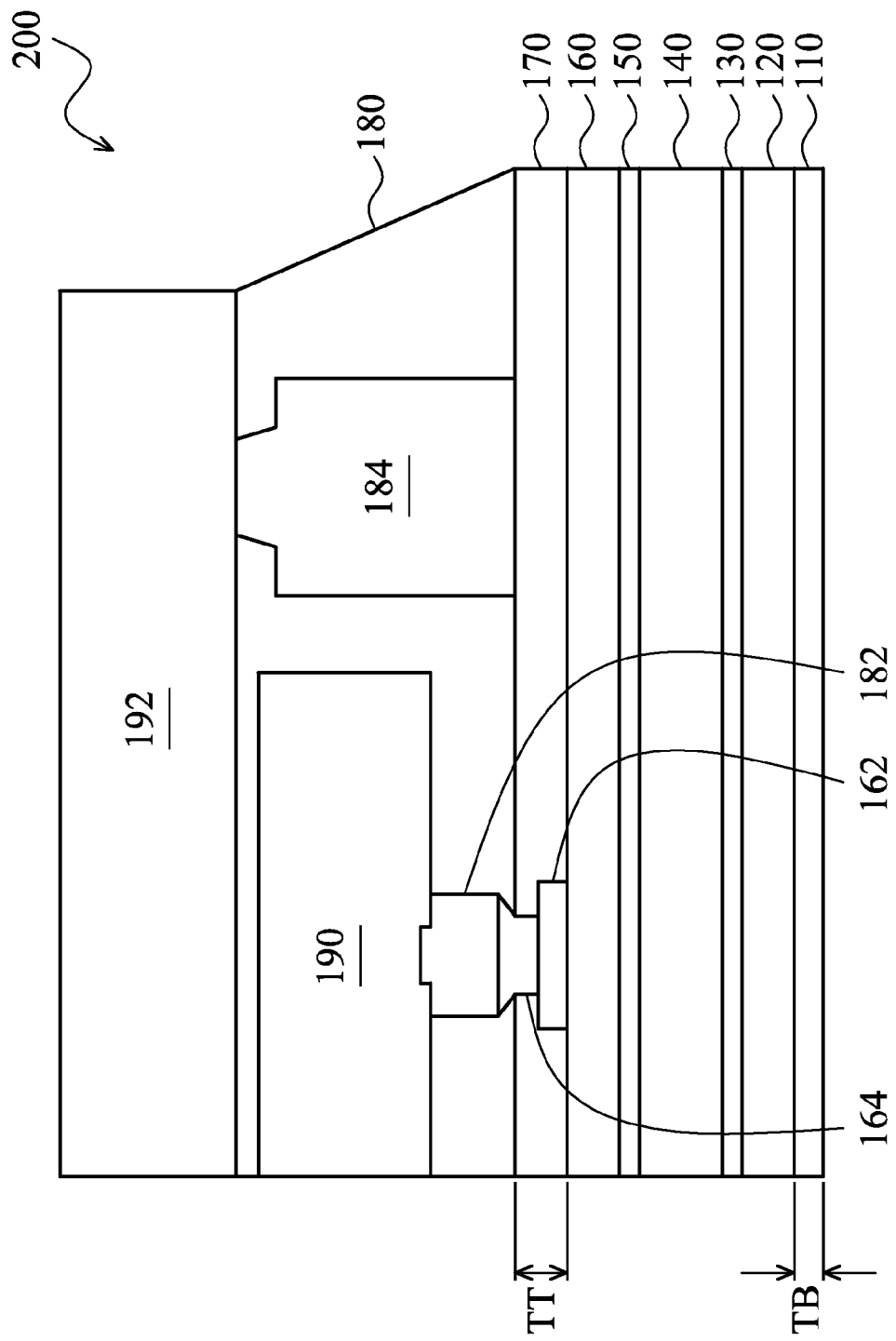
FIG. 6 shows an example using a package on package configuration.

In the package 200 of FIG. 6, a second package 192 is mounted over the IC 190 and connected to the substrate in a package-on-package configuration. In this configuration, a lower density I/O ball grid array (BGA) array of solder balls 184 connects the die 192 to conductive pads 162 on the substrate 140. FIG. 6 also shows the bottom solder mask 110 has an average thickness (which may be a uniform thickness) less than the top solder mask 170. In a package product, the warpage control is an important factor for the process window, so the ability to control warpage is a useful tool. In a package on package configuration, the solder mask 110 will contact the PCB on which the package is to be subsequently mounted. Thus, controlling the warpage of the substrate 140 is given priority over controlling the warpage of the substrate (not shown) within package 192.

Figure 4A:
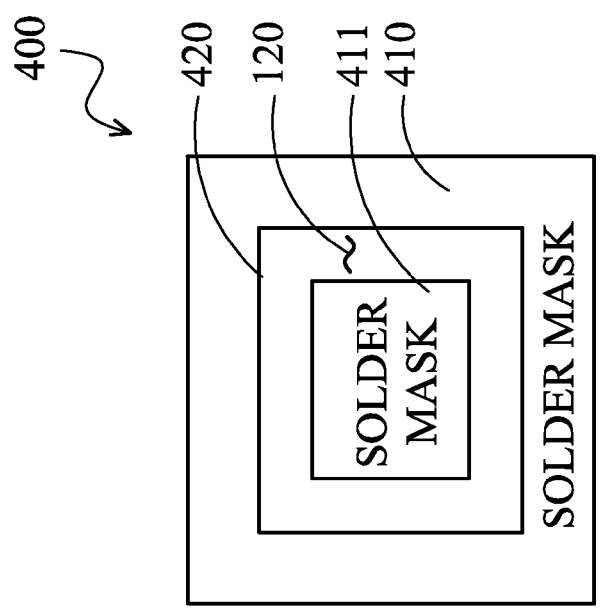
FIGS. 4A-4C show an embodiment having a groove in the bottom solder mask.
Figure 4B:
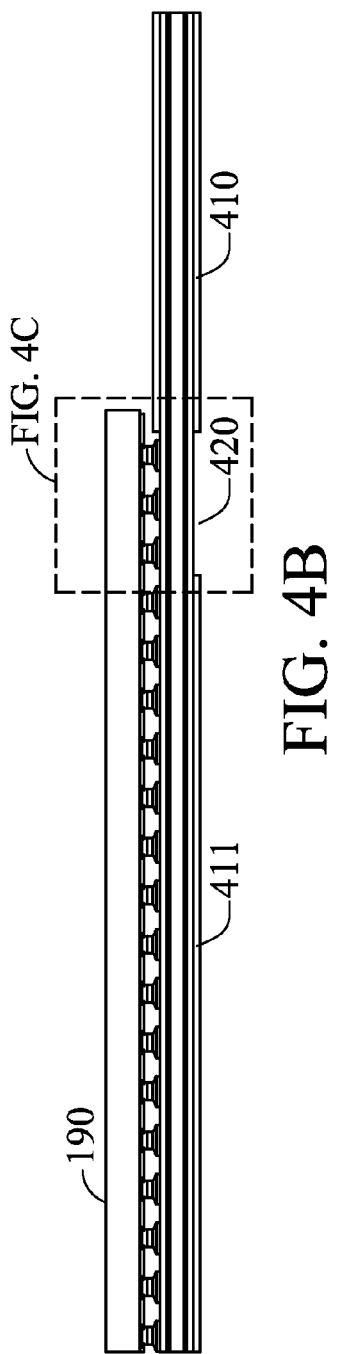
Figure 4C:
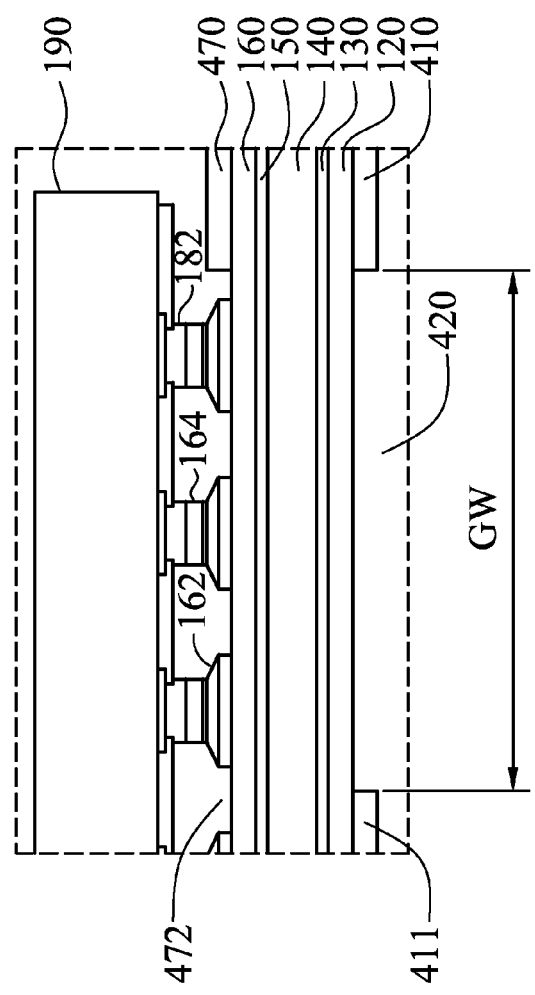

FIGS. 4A-4C show another embodiment of a substrate 400 in which the average thickness of the bottom solder mask 410, 411, 420 is controlled to control the package warpage. FIG. 4A is a bottom plan view of the substrate 400. FIGS. 4B and 4C are side cross section views showing the top solder mask 470 has at least one top groove 472 at a locations of one of the conductive pads 162, and the bottom solder mask 410, 411 has at least one bottom groove 420. The top solder mask 470 may have a thickness of 40 micrometers, and may occupy 40% of the total area of the substrate. The bottom groove 420 has a plurality of sides (FIG. 4A), including a respective side parallel to each respective side of the substrate 400. Thus, the bottom groove 420 is located between an inner rectangular portion 411 of the bottom solder mask and an outer rectangular frame portion 410 of the bottom solder mask. The bottom solder mask 410, 411, 420 has a first portion 410, 411 and a second (groove) portion 420, where the thickness of the first portion 410, 411 is greater than a thickness of the second (groove) portion 420.

In some embodiments, the solder mask 410, 420, 411 has a thickness of zero in the bottom groove 420, completely exposing the dielectric layer 120. In other embodiments (not shown), the bottom groove 420 has a thickness greater than zero, but less than the thickness of the first portion 410, 411 of the bottom solder mask. The area of the groove 420 may be varied, to control the average thickness of the solder mask 410, 411, 420. For example, the groove 420 may make up from 10% to 60% of the total area of the substrate's bottom face.

In the example of FIGS. 4B and 4C, the groove 420 is positioned directly beneath the groove 472 in the top solder mask 470. Although FIGS. 4B and 4C show in example in which both grooves 420 and 472 have the same width GW, in other embodiments, the bottom groove 420 may have a larger or smaller width than the top groove 472. For example, to achieve a convex warpage shape, the top groove may occupy 40% of the total area and the bottom groove may form 10% of the total area. For a concave warpage, the bottom groove 420 would occupy an area percentage larger than that of the top groove 472.

Figure 5A:
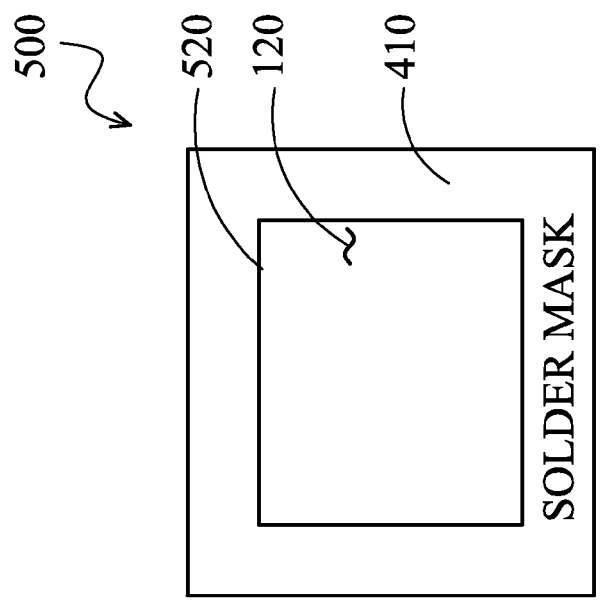

FIGS. 5A-5C show another embodiment of a substrate 500 in which the average thickness of the bottom solder mask 410, 520 is controlled to control the package warpage. FIG. 5A is a bottom plan view of the substrate 500. FIGS. 5B and 5C are side cross section views showing the top solder mask 470 has at least one top groove 472 at a locations of one of the conductive pads 162, and the bottom solder mask 410 has at least one bottom window 520. The bottom window 520 has a plurality of sides (FIG. 5A), including a respective side parallel to each respective side of the substrate 500. The bottom solder mask 410, 520 has a first portion 410 and a second (window) portion 520, where the thickness of the first portion 410 is greater than a thickness of the second (window) portion 520. In some embodiments, the solder mask 410, 520 has a thickness of zero in the bottom window 520, completely exposing the dielectric layer 120. In other embodiments (not shown), the bottom window 520 has a thickness greater than zero, but less than the thickness of the first portion 410 of the bottom solder mask. The area of the window 520 may be varied, to control the average thickness of the solder mask. For example, the window 520 may make up from 10% to 60% of the total area of the substrate's bottom face.

One of ordinary skill in the art can readily determine (through simulation or experiment), for any specific package application, whether the groove 420 of FIGS. 4A-4C or the window 520 of FIGS. 5A-5C provides the desired warpage effect and level. Generally, it is believed that the groove design and window may provide better coplanarity control enhancement, and the window design enhances routability. A groove may be advantageous, for example, in a package having a bump on trace configuration.

Figure 7:
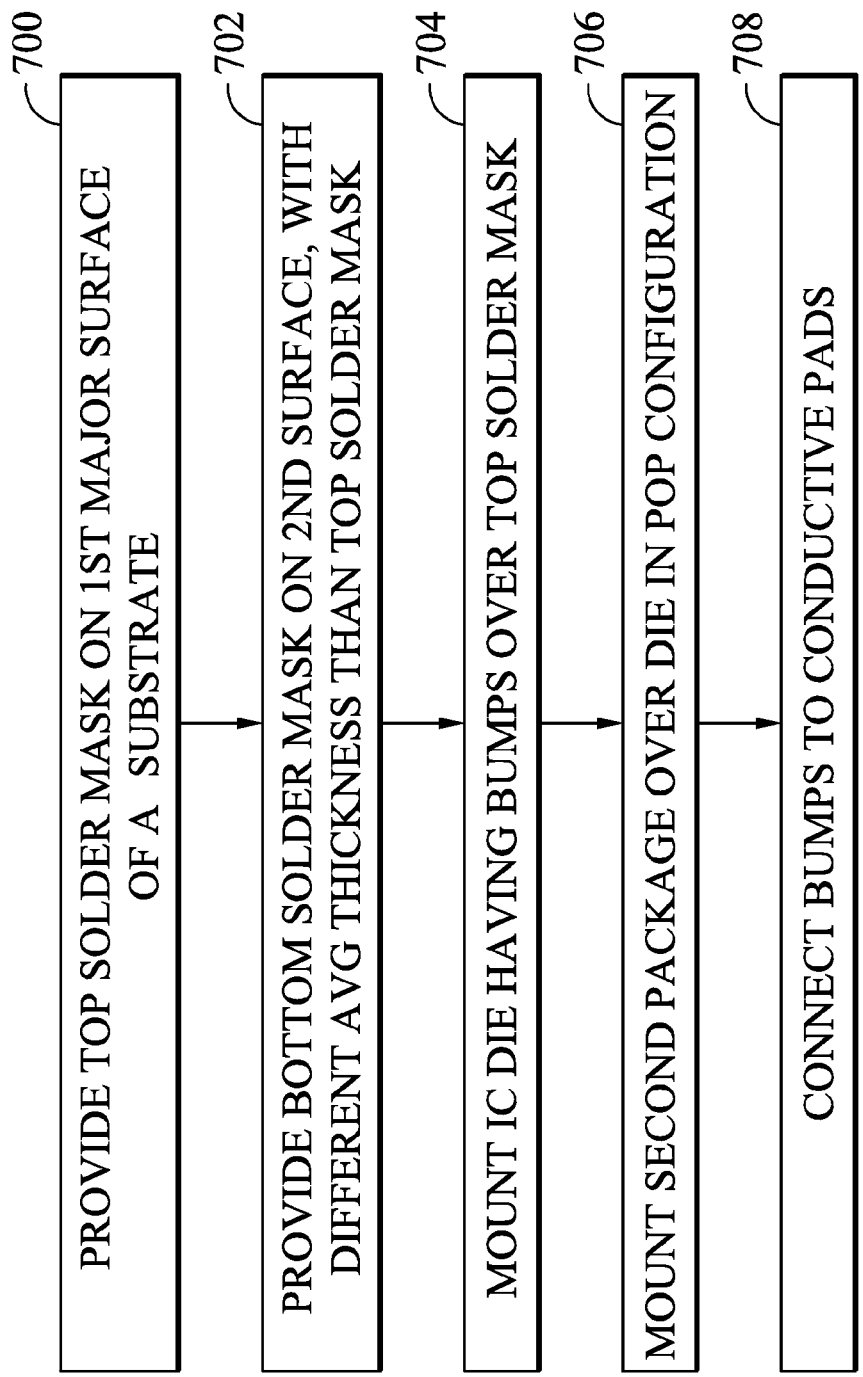
FIG. 7 is a flow chart of a method of fabricating an IC package.

FIG. 7 is a flow chart of a method for fabricating an IC package.

At step 700, a top solder mask is provided on a first major surface of a substrate, the first major surface having conductive pads. In some embodiments, step 700 includes forming at least one top groove at a location of one of the conductive pads.

At step 702, a bottom solder mask is provided on a second major surface of the substrate opposite the first major surface. The bottom solder mask has a different average thickness than the top solder mask. In some embodiments, step 702 includes forming at least one bottom groove. In some embodiments, the bottom groove has a plurality of sides, including a respective side parallel to each respective side of the substrate. In some embodiments, the bottom solder mask has a first portion and a second portion, and a thickness of the first portion is greater than a thickness of the second portion. In some embodiments, the top solder mask has a substantially uniform thickness (excluding the area of the bumps) greater than the thickness of the bottom solder mask.

At step 704, an integrated circuit die is mounted over the top solder mask, the die having solder bumps.

At step 706 a second package is optionally mounted over the die in a package on package configuration. In other embodiments, the second package is omitted (e.g., as shown in FIGS. 1, 4B and 5B).

At step 708, the solder bumps are connected to the conductive pads.

Figure 8:
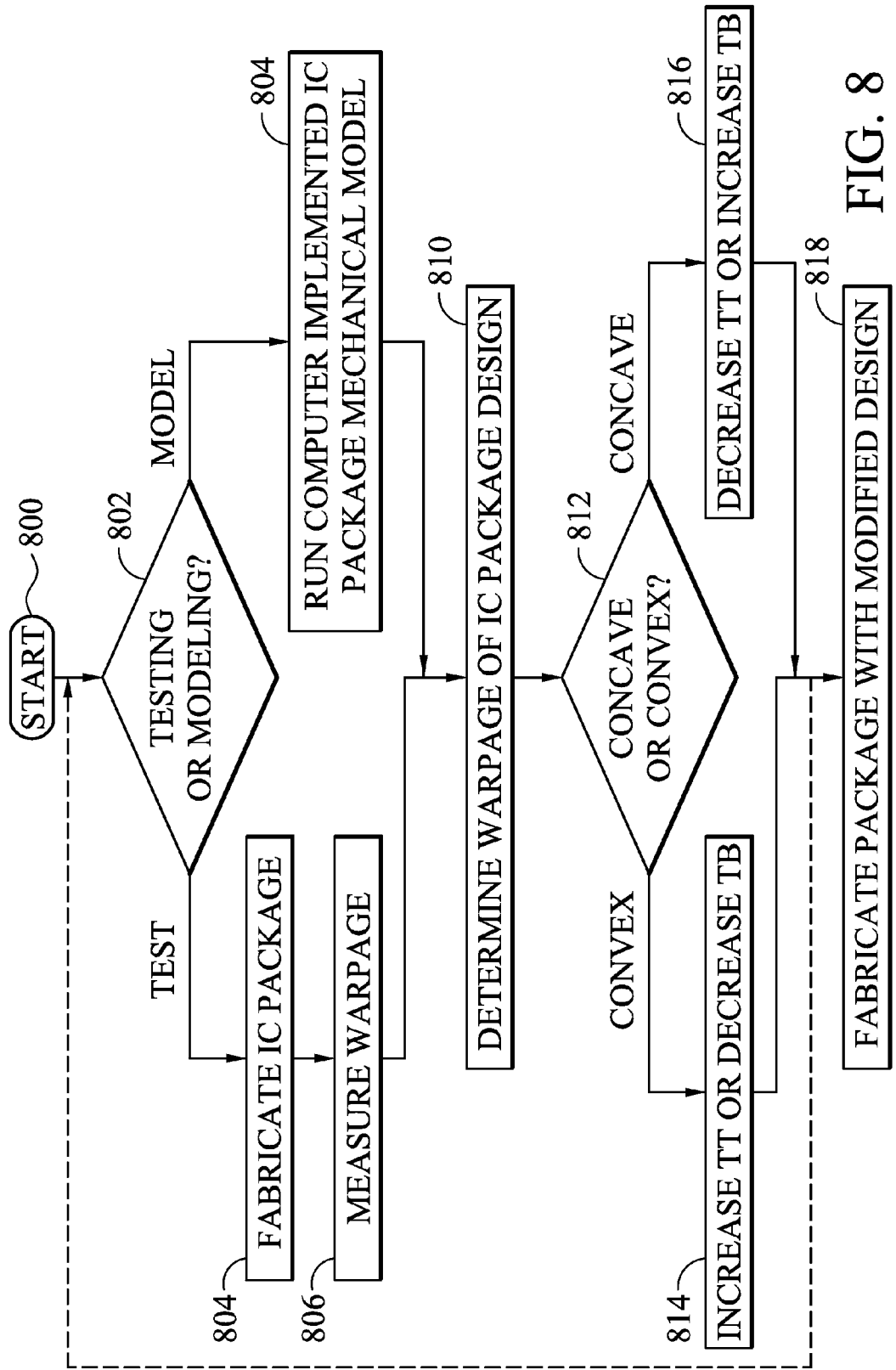
FIG. 8 is a flow chart of a method of designing and fabricating an IC package.

FIG. 8 is a flow chart of a method for designing and fabricating an IC package.

At step 800 the method begins.

At step 802, a decision is made to either use test data from a fabricated package or mechanical computer modeling data.

At step 804, if test data is to be used, an IC package is fabricated. The IC package design includes a substrate having a top solder mask on a first major surface and a bottom solder mask on a second major surface opposite the first major surface. The first major surface has an IC die mounted over the top solder mask;

At step 806, the warpage of the IC package is measured.

At step 808, if computer modeling data are to be used, the computer model is executed. The stress distribution and displacements of each point in a three dimensional space is determined.

At step 810, based on the test data or computer model, the warpage of the IC package is determined.

At step 812, a determination is made whether the warpage is convex or concave.

At step 814, if the warpage is convex, then the modifying includes either increasing an average thickness of the top solder mask or decreasing an average thickness of the bottom solder mask.

At step 816, if the warpage is concave, the modifying includes either decreasing an average thickness of the top solder mask or increasing an average thickness of the bottom solder mask.

After modifying the design, as indicated by the dashed line in FIG. 8, steps 802-816 may optionally be repeated in a closed loop process, until the test results or model indicate that the desired reduction in warpage has been achieved.

Alternatively, in an open loop process embodiment, based on empirical data, steps 802-816 are only performed once, and a final modified solder mask thickness is selected, either based on a calculation of an a thickness change, or based on a table lookup in a table of warpage versus top and bottom solder mask thickness from previous testing.

At step 818, the design is modified, including modifying an average thickness of one of the group consisting of the top solder mask and the bottom solder mask, so as to reduce the warpage. Then an IC package is fabricated according to the modified design.

In the examples described above, the warpage of the package is symmetrical, and the modified solder mask is also symmetrical. In other embodiments, where asymmetric warpage occurs, two different solder mask thicknesses may be used to reduce asymmetry in warpage.

In some embodiments, a package comprises a substrate having a top solder mask on a first major surface and a bottom solder mask on a second major surface opposite the first major surface. The first major surface has conductive pads. The bottom solder mask has a different average thickness than the top solder mask. An integrated circuit die is mounted over the top solder mask. The die has solder bumps connected to the conductive pads.

In some embodiments, a method comprises: providing a top solder mask on a first major surface of a substrate, the first major surface having conductive pads; providing a bottom solder mask on a second major surface of the substrate opposite the first major surface, the bottom solder mask having a different average thickness than the top solder mask; mounting an integrated circuit die over the top solder mask, the die having solder bumps; and connecting the solder bumps to the conductive pads.

In some embodiments, a method comprises: determining a warpage of an integrated circuit (IC) package design, the IC package design including a substrate having a top solder mask on a first major surface and a bottom solder mask on a second major surface opposite the first major surface, the first major surface having an IC die mounted over the top solder mask; modifying the design, including modifying an average thickness of one of the group consisting of the top solder mask and the bottom solder mask, so as to reduce the warpage; and fabricating an IC package according to the modified design.

Although the subject matter has been described in terms of exemplary embodiments, it is not limited thereto. Rather, the appended claims should be construed broadly, to include other variants and embodiments, which may be made by those skilled in the art.

What is claimed is:

1. A package comprising:
    a substrate having a top solder mask on a first major surface and a bottom solder mask on a second major surface opposite the first major surface, wherein the first major surface has conductive pads, wherein the bottom solder mask has a different average thickness than the top solder mask, and wherein the bottom solder mask has: an inner rectangular portion at a center thereof, and at least one bottom groove in the form of a rectangular ring surrounding the inner rectangular portion; and
    an integrated circuit die mounted over the top solder mask, wherein the die has solder humps connected to the conductive pads.

2. The package of claim 1, wherein the top solder mask has at least one top groove at a location of one of the conductive pads.

3. The package of claim 2, wherein the bottom groove has a plurality of sides, including a respective side parallel to each respective side of the substrate.

4. The package of claim 2, wherein the bottom groove is located between the inner rectangular portion of the bottom solder mask and an outer rectangular frame portion of the bottom solder mask, the outer rectangular frame portion surrounding the at least one bottom groove.

5. The package of claim 2, wherein the solder mask has a thickness of zero in the bottom groove.

6. The package of claim 1, wherein the bottom solder mask has a first portion and a second portion, and a thickness of the first portion is greater than a thickness of the second portion.

7. The package of claim 1, further comprising a second package mounted over the die and connected to the substrate in a package-on-package configuration.

8. A package comprising:
a substrate having a top solder mask on a first major surface and a bottom solder mask on a second major surface opposite the first major surface, wherein the first major surface has conductive pads, wherein the bottom solder mask has a different average thickness than the top solder mask, and wherein the bottom solder mask has; an inner rectangular portion, at least one bottom groove in the form of a rectangular ring surrounding the inner rectangular portion, and an outer rectangular frame portion surrounding the at least one bottom groove; and
an integrated circuit die mounted over the top solder mask, wherein the die has solder bumps connected to the conductive pads.

9. The package of claim 8, wherein
the top solder mask has at least one top groove at a locations of one of the conductive pads,
the bottom groove has a plurality of sides, including a respective side parallel to each respective side of the substrate, and
the solder mask has a thickness of zero in the bottom groove.

10. The package of claim 9, wherein the bottom groove of the bottom solder mask is positioned directly beneath the top groove in the top solder mask.

11. The package of claim 8, further comprising a second package mounted over the die and connected to the substrate in a package-on-package configuration.

12. The package of claim 8, wherein the bottom groove occupies from 10% to 60% of a total area of the second major surface.

13. The package of claim 8, wherein the top groove occupies 40% of a total area of the first major surface and the bottom groove occupies 10% of a total area of the second major surface.

* * * * *